(12) United States Patent
Ross et al.

(10) Patent No.: US 10,115,605 B2
(45) Date of Patent: Oct. 30, 2018

(54) VACUUM ASSISTED SEALING PROCESSES AND SYSTEMS FOR INCREASING AIR CAVITY PACKAGE MANUFACTURING RATES

(71) Applicant: RJR Technologies, Inc., Oakland, CA (US)

(72) Inventors: Richard J. Ross, Oakland, CA (US); John Ni, Oakland, CA (US); Raymond J. Bregante, Oakland, CA (US); Biao Fu, Oakland, CA (US); Michael Bregante, Oakland, CA (US); Cresencio Amparo, Oakland, CA (US)

(73) Assignee: RJR Technologies, Inc., Oakland, CA (US)

( * ) Notice: Subject to any disclaimer, the term of this patent is extended or adjusted under 35 U.S.C. 154(b) by 136 days.

(21) Appl. No.: 15/203,732

(22) Filed: Jul. 6, 2016

(65) Prior Publication Data
US 2018/0012776 A1    Jan. 11, 2018

(51) Int. Cl.
*H01L 21/52*    (2006.01)
*H01L 21/50*    (2006.01)

(52) U.S. Cl.
CPC .............. *H01L 21/52* (2013.01); *H01L 21/50* (2013.01)

(58) Field of Classification Search
CPC ...................................................... H01L 21/52
See application file for complete search history.

(56) References Cited

U.S. PATENT DOCUMENTS

| | | | |
|---|---|---|---|
| 5,056,296 A | 10/1991 | Ross | |
| 5,572,070 A | 11/1996 | Ross | |
| 5,706,579 A | 1/1998 | Ross | |
| 5,816,158 A | 10/1998 | Ross | |
| 6,214,152 B1 | 4/2001 | Ross | |
| 6,511,866 B1 | 1/2003 | Ross | |
| 8,560,104 B2 | 10/2013 | Rotay | |
| 8,639,373 B2 | 1/2014 | Rotay | |
| 8,759,965 B2 | 6/2014 | Rotay | |
| 2003/0013234 A1 | 1/2003 | Bregante et al. | |
| 2011/0084371 A1 | 4/2011 | Rotay et al. | |
| 2011/0084376 A1 | 4/2011 | Rotay et al. | |
| 2011/0086469 A1 | 4/2011 | Rotay et al. | |
| 2011/0087353 A1 | 4/2011 | Rotay et al. | |
| 2011/0087356 A1 | 4/2011 | Rotay et al. | |

*Primary Examiner* — Errol Fernandes
(74) *Attorney, Agent, or Firm* — Law Offices of Damon L. Boyd, PLLC (57) ABSTRACT

The present disclosure describes a sealing processes and structure for sealing air cavity electronic packages using a thermosetting, thermal plastic, other known or as yet unknown adhesives, or hybrid combinations of such adhesive(s). Processes disclosed comprise steps of providing a base and a lid, with at least one of the base and the lid having a mating surface coated with the adhesive. Initially, an air gap is maintained between the base, the lid, and the adhesive and a vacuum is generated around the base, the lid, and the adhesive. Once the vacuum has been generated, the base and the lid are mated to create a mated package assembly with a vacuum therein. After the mating, the mated package assembly is heated to a curing temperature to cure the adhesive, and pressure may be applied as well. Because the air within the mated package assembly has been evacuated prior to heating, there is no air pressure build-up therein, reducing or eliminating the presence of blowouts and pin holes.

20 Claims, 12 Drawing Sheets

VACUUM ASSISTED SEALING PROCESSES AND SYSTEMS FOR INCREASING AIR CAVITY PACKAGE MANUFACTURING RATES

FIELD

The present disclosure relates generally to sealing processes and sealing apparatus that use adhesives to seal electronic packages, devices, containers and the like that, after sealing, have a cavity within. The present disclosure also relates generally to locating mechanisms to maintain consistent part alignment and height of the sealed components.

BACKGROUND

Conventional methods for sealing electronic packages having a cavity therein (or "air cavity packages") use adhesives to attach a package header (typically, a two piece package made from ceramic ring attached to a base with leads attached, or other similar materials and designs) and/or a package base/body combination (typically, a three piece air cavity plastic package that uses a base, a body or sidewall, and a lid) and a package lid mated together in known fixtures, sealing systems, "clip and bake" systems, or systems and processes for mating and sealing the components. In this regard, an organic adhesive is typically applied to a mating surface of a base, body and/or lid, and the parts are aligned and put into contact. Pressure is applied to the interfaces between the pieces, and the adhesive are heated until the adhesive is cured, sealing the package.

In early prior art, most electronic package sealing was accomplished by starting with the assembly of two or more pieces (e.g., a base and a lid) with an adhesive, all starting at or near room temperature. Heat and mechanical force (e.g., clamping) would then be applied to keep the assembly in alignment and to cause the adhesive to flow and cure.

However, using such procedures often resulted in undesirable anomalies such as "pin holes" or "blowouts." Specifically, when the adhesive between clamped pieces is heated from room temperature to its curing temperature, the adhesive becomes soft and sticky and the clamping force causes it to flow and make a leak-free seal. However, this seal entraps and contains whatever volume of gas (e.g., air, inert gas, etc.) that is within the package pieces at that time. The result of continued heating causes the gas pressure in the package to rise, and because the higher temperature also causes the adhesive to become thinner (i.e., have a lower viscosity), its ability to hold the gas is diminished, forcing gas through the seal and creating blowouts or pin holes.

With some adhesives (e.g., such as B stage adhesives), as it is subjected to heat, it transitions from a solid to a liquid. As the adhesive continues to heat, it advances to a hardened state. At early stages of heating, if the adhesive has not advanced to a semi-hardened state, when a blowout occurs the adhesive can reflow and fill the hole. However, if the adhesive has hardened too much, it may not be able to reflow over the blowout, leaving a pin hole or blowout.

Figure 1:
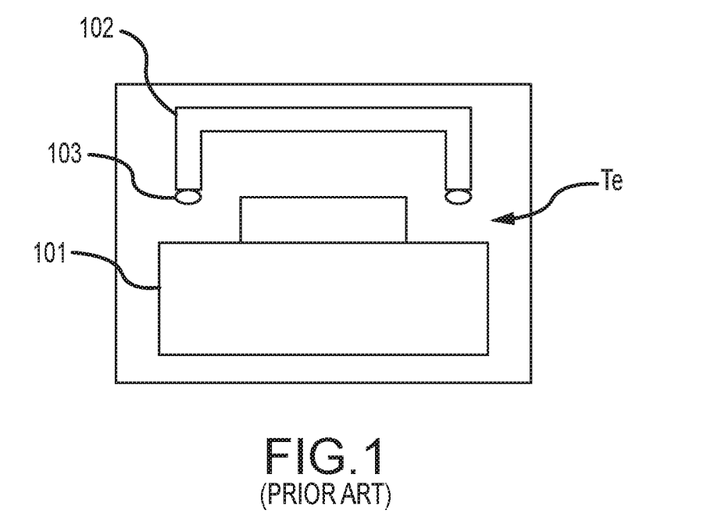
FIG. 1 illustrates a base and lid of an electronic air cavity package being preheated to an equilibrium temperature $T_E$.

Attempts to reduce blowouts such as those disclosed in U.S. Pat. No. 5,056,296 entitled "Iso-Thermal Seal Process for Electronic Devices" have included preheating package components along with the mating surfaces that have been coated with an adhesive prior to mating the components and applying pressure. For example, with reference to FIG. 1, by preheating the base 101 and the lid 102 while keeping the base 101 and the lid 102 separated, a temperature equilibrium ($T_e$) is created amongst the components and, importantly, the air space therein. Because equilibrium is obtained prior to mating, the pressure differentials are reduced, thus reducing or eliminating blowouts in the thermosetting adhesive 103. While a positive pressure may remain after the lid makes contact with the body by virtue of the closing of the cavity, the remaining pressure generally will not be sufficient to cause pin holes or blowouts.

However, while such preheating is an effective solution for preventing blowouts, it has some disadvantages as well. For example, preheating requires a waiting period for the temperature of the components to rise to the desired level. During this waiting period, no other processing can take place on the package. Depending on the mass of the package components, this waiting period can last several minutes, limiting the number of sealed packages that can be produced over a given time period (e.g., units per hour or "UPH").

Additionally, using existing manufacturing processes, obtaining a sealed package that has consistent alignment and height each time can be challenging. Among other reasons, contributors to inconsistent alignment and height include variations in the specifications of the components that make up the package (e.g., base, lid, epoxy thickness variations, etc.). These components have their own specifications and tolerances. When the tolerance extremes (e.g., high end for lid, high end for base, etc.) are compounded, inconsistencies in alignment and height are exacerbated. Likewise, bond line thicknesses may vary depending on factors such as the amount of adhesive applied, the pressure applied during the sealing process, the heat up and flow out of the adhesive, and the like.

As new technologies develop which reduce the cost for air cavity electronic packages, the demand for the packages increases. Thus, to meet this demand, apparatus, systems, and methods that increase UPH yet maintain the quality and integrity of the packages produced, are desirable.

SUMMARY OF THE INVENTION

While the ways in which the present disclosure address the disadvantages of the prior art will be discussed in greater detail below, in general, the present disclosure is directed to sealing processes, systems, and structure for sealing air cavity electronic packages using various adhesives now known or as yet unknown in the art. For example, adhesives contemplated herein include thermosetting adhesives, thermal plastic adhesives, other known or as yet unknown adhesives, or hybrid combinations of such adhesive(s). As discussed in more detail below, air cavity packages as disclosed herein may include any electronic packages now known or as yet unknown in the art that are comprised of two or more components that are sealed together using the aforementioned adhesives, which when sealed together, result in a package that has an air cavity around a die inside the package.

Processes in accordance with the present disclosure comprise steps of, in the case of two-piece packages, providing a base (or "header") and a lid (e.g., such as used in ceramic and composite packages), or in the case of three piece packages, providing a base attached to a sidewall (also known as a body) and a lid to be attached to the base/sidewall combination, or a lid attached to a sidewall and a base to be attached to the lid/sidewall combination, with at least one of the base, sidewall and or the lid having a mating surface coated with the adhesive.

Initially, an air gap is maintained between the at least two of the package components (e.g., header, base, sidewall, lid, etc.) and the internal pressure of the package is decreased before it is sealed by generating a vacuum around and within the package components, which extracts the gas from inside the package body, thereby creating very little, if any, internal pressure build up inside the cavity when the components are sealed. By using such a vacuum process, the sealing process is accelerated, and as a result, the UPH of the electronic packages assembled is increased. After the mating, the mated package assembly is heated to a curing temperature to cure the adhesive. Pressure to assist with sealing the package may be applied as well.

Because the air within the mated package assembly has been evacuated prior to heating, there is no air pressure build-up therein (or potentially, any small positive air pressure at all), reducing or eliminating the presence of blowouts and pin holes. Moreover, because a vacuum can be generated substantially quicker in comparison to heating the components from room temperature, for example, in less than a minute, there is no need to wait for the various components to come to the curing temperature before mating and beginning the curing of the adhesive, hastening the entire package manufacturing process while avoiding blowout and pin holes.

Additionally, processes, systems, and structure in accordance with the present disclosure provide the ability to process multiple packages simultaneously and with shorter waiting times for beginning the processing of additional package components. For example, when using lead frame packages, multiple packages can be assembled simultaneously by using location features in the lead frame to assist in alignment, thus allowing assembly with more accurate tolerances, for example, within ±1 mil.

Further, in accordance with various aspects of the disclosure, internal compression stops may be provided that prevent compression of mated package assemblies heights lower than the internal compression stop. The internal compression stop thus ensures that mated package assemblies have more consistent heights, irrespective of variations in the specifications of the components that make up the final mated package assembly or variations in bond line thicknesses. In various embodiments, the internal compression stop may adjustable so that heights of the mated package assemblies may be varied.

BRIEF DESCRIPTION OF THE DRAWINGS

The accompanying drawings are included to provide a further understanding of the disclosure and are incorporated in and constitute a part of this specification, illustrate embodiments of the disclosure, and together with the description serve to explain the principles of the disclosure, wherein like numerals denote like elements and wherein.

DETAILED DESCRIPTION OF THE ILLUSTRATED EMBODIMENTS

Persons skilled in the art will readily appreciate that various aspects of the present disclosure can be realized by any number of processes, systems, structures, and components configured to perform various functions disclosed herein. Stated differently, other such processes, systems, structures, and components can be incorporated herein to perform the intended functions. It should also be noted that the accompanying drawing figures referred to herein are not all necessarily drawn to scale, and may be exaggerated to illustrate various aspects of the present disclosure, and in that regard, the drawing figures should not be construed as limiting.

Additionally, the present disclosure contemplates the manufacture of various electronic packages now known or as yet unknown in the art. While at various times specific embodiments of electronic packages and the components that such packages are manufactured from are referred to herein, it should be appreciated that this disclosure is not limited to those embodiments. For example, in some embodiments, the air cavity package may be comprised of two or more components such as a header and a lid, while in other embodiments, the packages may be comprised of three or more components, such as a base attached to a sidewall and a lid attached to the base/sidewall combination, or a lid attached to a sidewall and a base attached to the lid/sidewall combination. Moreover, those skilled in the art will appreciate that a variety of types of electronic packages and materials used therein are contemplated herein and within the scope of the present disclosure, including ceramic, metals, glass, polymers, and the like. Thus, for ease of reference, when referring to an air gap that is maintained between two components of an electronic package, the two components may referred to herein as a "base" and a "lid," though those terms should not be construed as limiting the package configuration to any particular number of components, structure, or materials.

Figure 2:
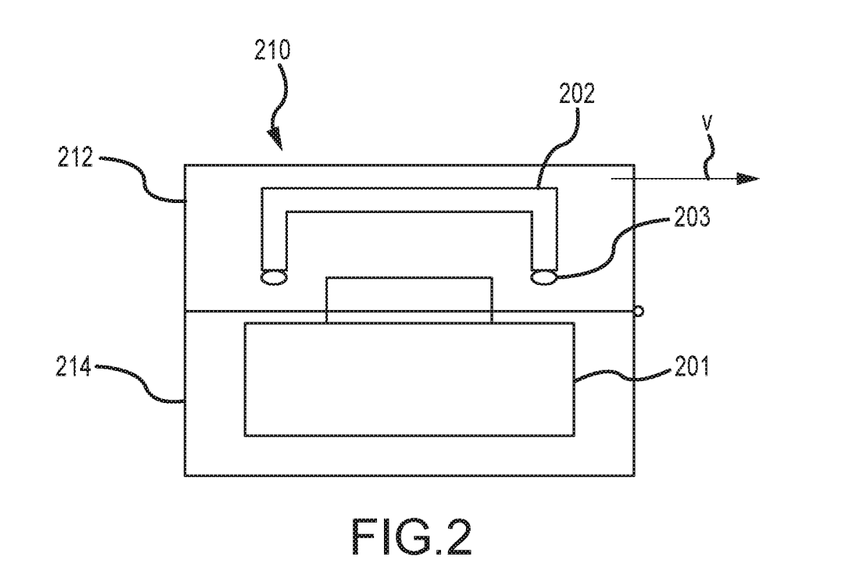
FIG. 2 illustrates a base and lid of an electronic package maintained with an air gap therebetween inside a vacuum box with a vacuum (V) being generated therein.

With the above being noted and with reference to FIG. 2, an exemplary vacuum sealing system 200 for electronic packages is shown. The vacuum sealing system 200 provides a process for sealing air cavity electronic packages (or simply, "packages") to create a mated package assembly 204 comprised of a base 201 and a lid 202, either or both of which may have a mating surface coated with an adhesive 203. In various embodiments, additional components such as sidewall frames, printed circuit board components, leads and the like, may also be included. The various package components may comprise any known, conventional materials as well as those as yet unknown, and still fall within the scope of the present disclosure.

In accordance with the present disclosure, and with continued reference to FIG. 2, a vacuum sealing system 200 initially maintains an air gap between the base 201, the lid 202, and the adhesive 203, and a vacuum (V) is generated around these components, including in the cavity within the base 201 and the lid 202. In various embodiments, the vacuum (V) may be generated by placing the various package components in a vacuum box 210, maintaining the above-noted air gap, sealing the vacuum box 210, and using a vacuum pump (not shown) to draw the air out of the vacuum box 210.

Figure 3:
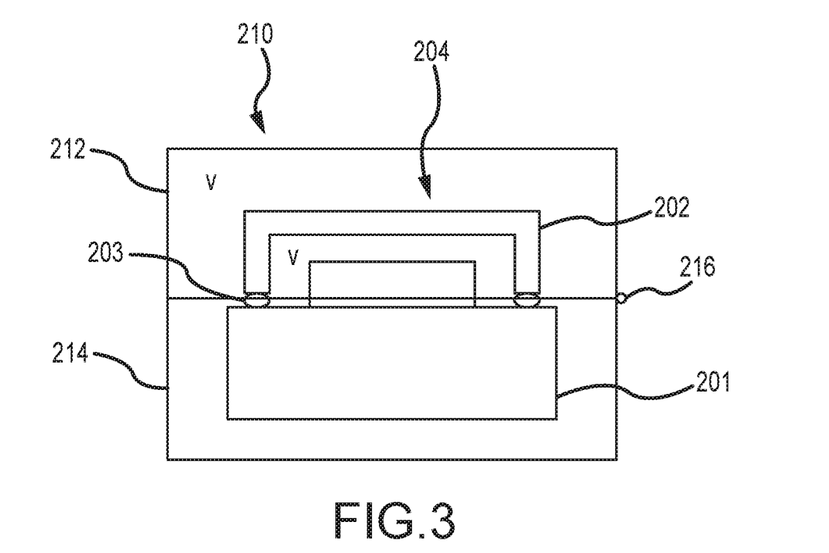
FIG. 3 illustrates a base and lid of an electronic package that have been mated inside a vacuum box with a vacuum (V) within the mated electronic package.

With reference now to FIG. 3, after the vacuum (V) is generated, the base 201 and the lid 202 are mated to create the mated package assembly 204 with the vacuum (V) therein. Once mated, the mated package assembly 204 is heated to a curing temperature to cure the adhesive 203. Heating of the mated package assembly 204 may be done by known or as yet unknown inductive, conductive, convective, or radiative heating mechanisms and elements, or some combination of these. While heating or after the mated package assembly 204 has been heated to an appropriate curing temperature (e.g., for common electronic package thermosetting adhesives, about 150° C. to about 185° C.) pressure may be applied to the components to further ensure a good seal.

Because the air within the mated package assembly 204 has been evacuated prior to heating, there is no air pressure build-up therein, reducing or eliminating the presence of blowouts and pin holes. Moreover, because a vacuum can be generated substantially quicker in comparison to heating the components from room temperature, for example, in less than a minute, there is no need to wait for the various components to come to the curing temperature before mating and beginning the curing of the adhesive 203. This substantially hastens the entire package manufacturing process while still avoiding blowout and pin holes.

After initially sealing and beginning the curing process, the mated package assembly 204 may be removed from the vacuum box 210, and additional processing of the mated package assembly 204, may be performed as needed. For example, even where not yet complete, the curing process may be continued outside of the vacuum box 210 at another station, freeing the vacuum box 210 for the processing of additional packages instead of waiting for the curing process to finish.

In accordance with various embodiments, the vacuum box 210 may comprise matched portions having a first portion 212 and a second portion 214 capable of enclosing one more package assemblies (both before and after mating). The first portion 212 and second portion 214 may be made of metal, such as steel, or alloys of steel, copper, and may have high thermal conductivity and sealing capabilities, such as aluminum which has been machined and anodized.

The first portion 212 and second portion 214 may be initially unconnected and then mated together by placing opposing surfaces of each in contact with one another, or alternatively, the first portion 212 and second portion 214 may be connected, for example by one or more hinges 216 that allow them to open and close about one another. In either connected or unconnected embodiments, various locating mechanisms including slots, receptacles, pins and the like may be used to ensure proper alignment between the first portion 212 and second portion 214. For example, the second portion 214 may have one or more pins protruding from a lower mating surface, and the first portion 212 may have holes corresponding to the pins such that when the first portion 212 and the second portion 214 are placed together, they are located accurately and consistently.

Additionally, in various embodiments, the second portion 214 may have various mechanisms for locating and securing the base 201 in a desired position, consistently and accurately. Such mechanisms include slots, receptacles, pins and other mechanical components now known or as yet unknown in the art which installed in or otherwise integrated with the second portion 214 and which allow consistent and accurate placement of the base 201 within the sealing system 200.

Similarly, the first portion 212 may include various mechanisms for locating and securing the lid 202 in a desired position, consistently and accurately. Such mechanisms also include slots, receptacles, pins and other mechanical components now known or as yet unknown in the art which are installed in or otherwise integrated with the first portion 212 and allow consistent and accurate placement of the lid 202 within the sealing system 200.

As one skilled in the art will appreciate, the dimensions of the various components of the sealing system 200 may be varied to accommodate a variety of package and lid sizes, and individual sealing systems 200, including the vacuum box 210 themselves may be adjustable, for example, by using different and/or adjustable mechanisms for locating bases 201 and lids 202 of varying sizes.

In accordance with various embodiments, the sealing systems 200 may be configured to process a plurality of corresponding bases 201, lids 202, and other related components in a single step. For example, in some embodiments, an array of bases 201, lids 202 and related components may be placed in the vacuum box 210 and processed (i.e., vacuum generated, heated to curing temperature, pressure applied, etc.) at the same time, further increasing the speed and resulting UPH of mated package assemblies 204.

Figure 4:
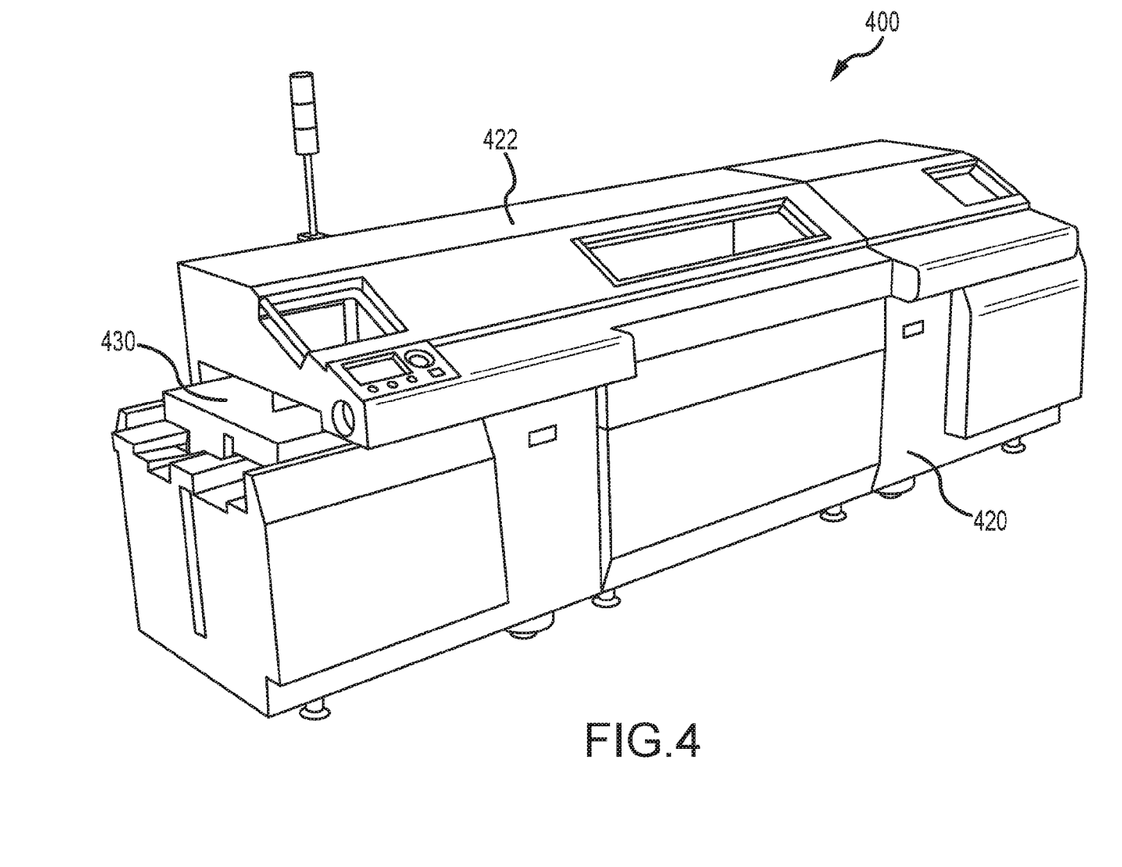
FIG. 4 is a perspective view of a sealing system in accordance with the present disclosure.
Figure 5:
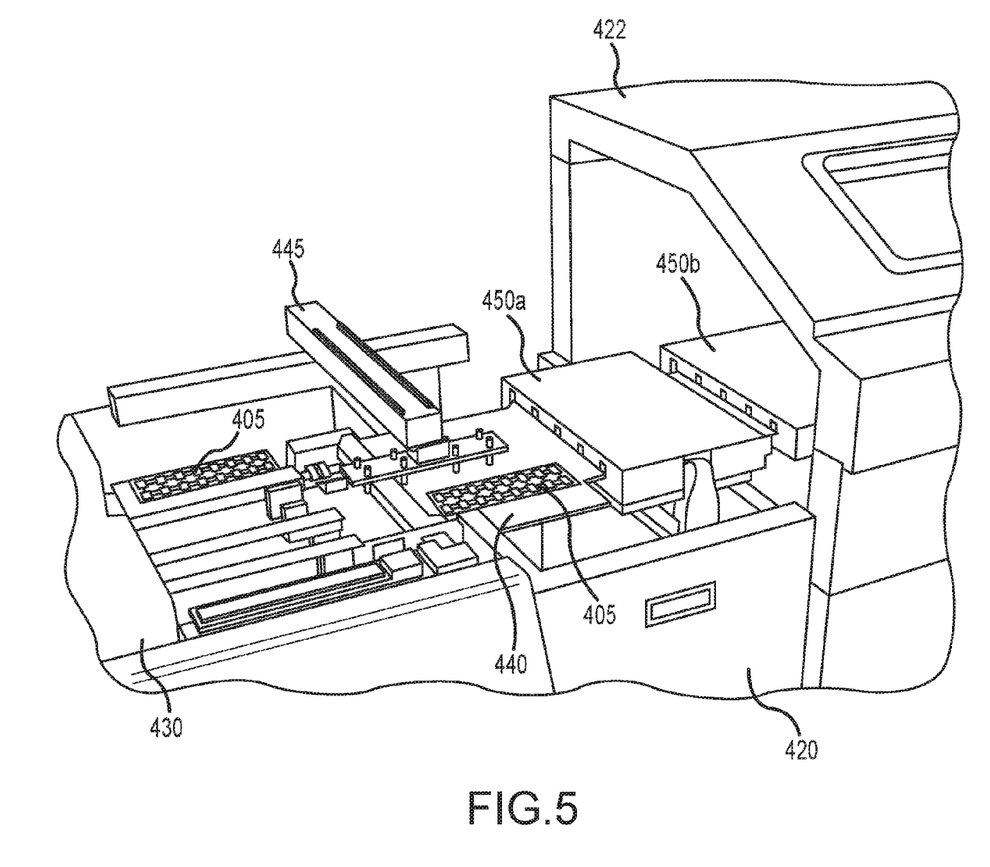
FIG. 5 is a close-up perspective view of a sealing system showing a package component station, a package component loading station, and a vacuum station.

For example, in this regard, with reference now to FIGS. 4 and 5, a plurality of corresponding electronic device package components 405 including headers, bases, sidewalls, lids, adhesives, lead frames, and other related components may be processed in a near fully- or fully-operated electronic device sealing system 400. The sealing system 400 may be configured as an enclosable or semi-enclosable system with various microcontrollers and software processes that control the movement, assembly and processing of package components 405 through the sealing system 400, increasing the number and speed at which assembled electronic device packages can be manufactured. The amount and speed at which the assembled electronic device packages can be manufactured may also be increased with specifically designed sealing plates and/or other alignment tooling.

For example, the sealing system 400 may comprise a base 420 and one or more covers 422 which house a plurality of package processing stations, including, for example, a package component station 430, a package component loading station 440, and one more package processing stations 450.

In accordance with various aspects of the present disclosure, the package component station 430 is a station containing a plurality of the various package components to be assembled into final mated package assemblies 404, organized by part and presented for access to be moved to the package component loading station 440. For example, the package component station 430 may include a plurality of package bases, package lids, and lead frames which are transported to the package component loading station 440 where they are positioned for assembly and processing in the various processing stations 450. In accordance with various exemplary embodiments, the transport of the package components may be accomplished via one or more automated robotic arms 445, though conveyor systems and human operators may also facilitate the transfer.

Once the package components have been appropriately positioned in the package component loading station 440, the components are transferred to the next station for processing. For example, in the presently described embodiment, the package components are transported to a vacuum station 450a where vacuum, mating, heating and pressure processes such as described above occur.

For example, as described in more detail below, in the vacuum station 450a, the package components are subjected to a vacuum (V) to evacuate the air within the package components to reduce or eliminate pin holes and blowouts that can occurring during the heating and curing process. Creating the vacuum (V) can occur in less than one minute.

Next the components are joined to create mated package assemblies 404 having a vacuum (V) therein. After mating, heat and pressure on the mated package assemblies 404 can be applied in the vacuum station 450a to begin the adhesive curing process. In some embodiments, it takes less than a minute to bring the mated package assemblies 404 to the curing temperature and sufficiently set the adhesive such that the mated package assemblies 404 can be moved from the vacuum station 450a to later stations 450b, 450c, etc. to finish the curing process and/or perform additional manufacturing operations.

As those skilled in the art will appreciate, typical thermosetting adhesive 403 curing can take as long as 12 minutes and many conventional systems required mated package assemblies to remain in the position for the entire curing process. Because of this, additional package assemblies cannot be processed using that particular unit of equipment until the mated package assemblies 404 currently being cured have finished curing.

However, vacuum station 450a only needs approximately 2 minutes to process the initial assembly and curing of the mated package assemblies 404 before the mated package assemblies 404 can be moved from vacuum station 450a, freeing the vacuum station 450a for the manufacture of additional mated package assemblies 404.

Figure 6:
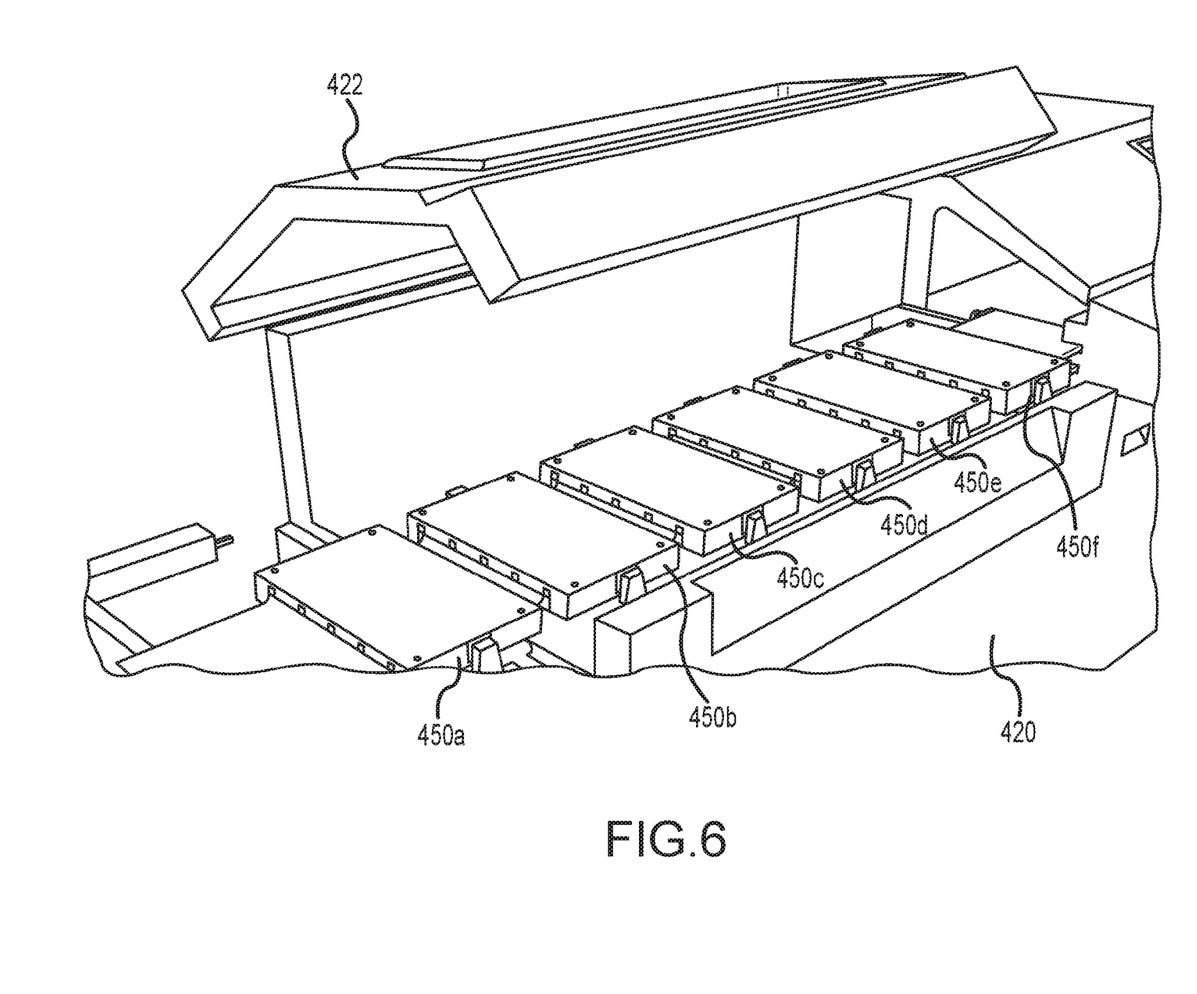
FIG. 6 is a close-up perspective view of a sealing system showing a vacuum station and subsequent curing stations.

Thus, in this embodiment, approximately every 2 minutes, another batch of package components 405 may begin the manufacturing process, and as they finish at vacuum station 450a, the now mated package assemblies 404 advance to later stations for curing and other processing. For example, in this regard and with reference to FIG. 6, assuming a 12 minute cure time and 2 minutes in the vacuum station 450a, five additional two minute curing stations 450b, 450c, 450d, 450e, 450f are provided. Those skilled in the art will appreciate, however, that the time and number of stations may vary depending on factors such as adhesives, curing times, and other related specifications and applications of the present disclosure.

Figure 7:
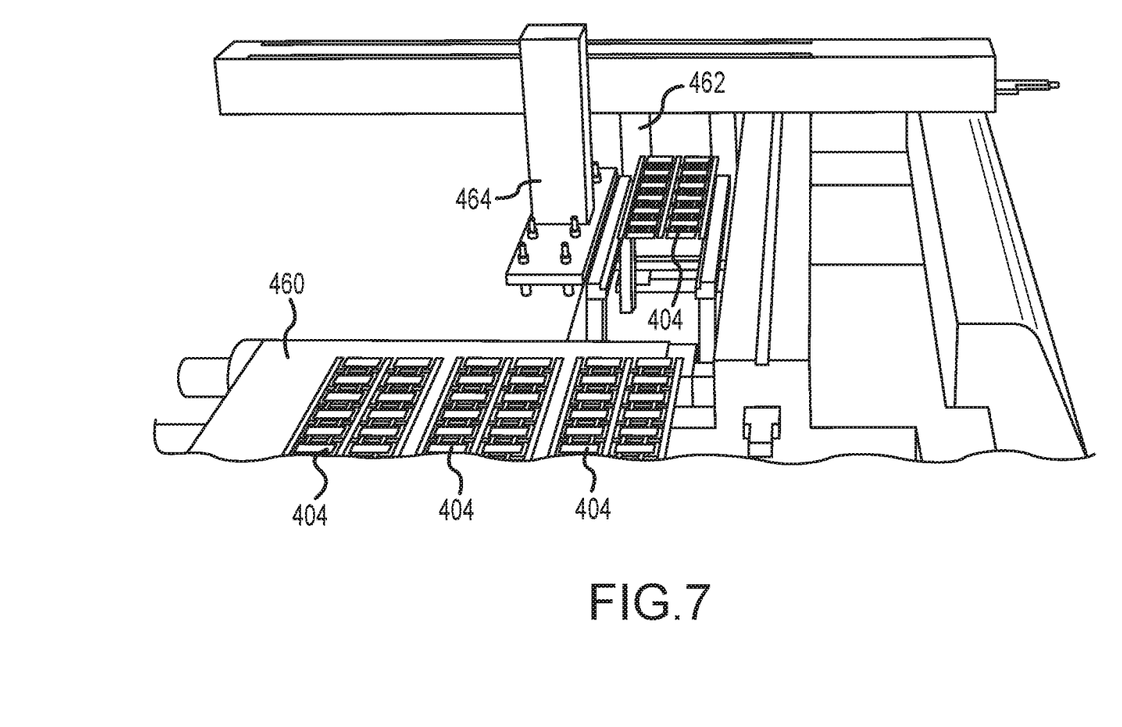
FIG. 7 is a close-up perspective view of a sealing system showing an unloading station.

With reference now to FIG. 7, after passing through curing stations 450b, 450c, 450d, 450e, 450f, the mated package assemblies 404 may move to an unloading station 460 where the mated package assemblies 404 await transport to a package cassette 462 for securing and transporting the cured, mated package assemblies 404. The mated package assemblies 404 may be moved to the package cassette 462 manually, or as illustrated, by a robotic unloader 464.

With reference now to FIGS. 8-13, an exemplary embodiment of the vacuum station 450a and its structure is illustrated. With specific reference to FIG. 8, a cross-sectional view of a vacuum station 450a is illustrated. Vacuum station 450a includes a vacuum box 600 into which various structure for processing package components are included. Vacuum box 600 may comprise an upper portion 662 and a lower portion 664 capable of separating (opened) to allow package components to be transferred within the vacuum box 600 and then sealed (closed) to define an internal volume for vacuum application, heating to a curing temperature, applying pressure, and other potential processing steps.

Figure 8:
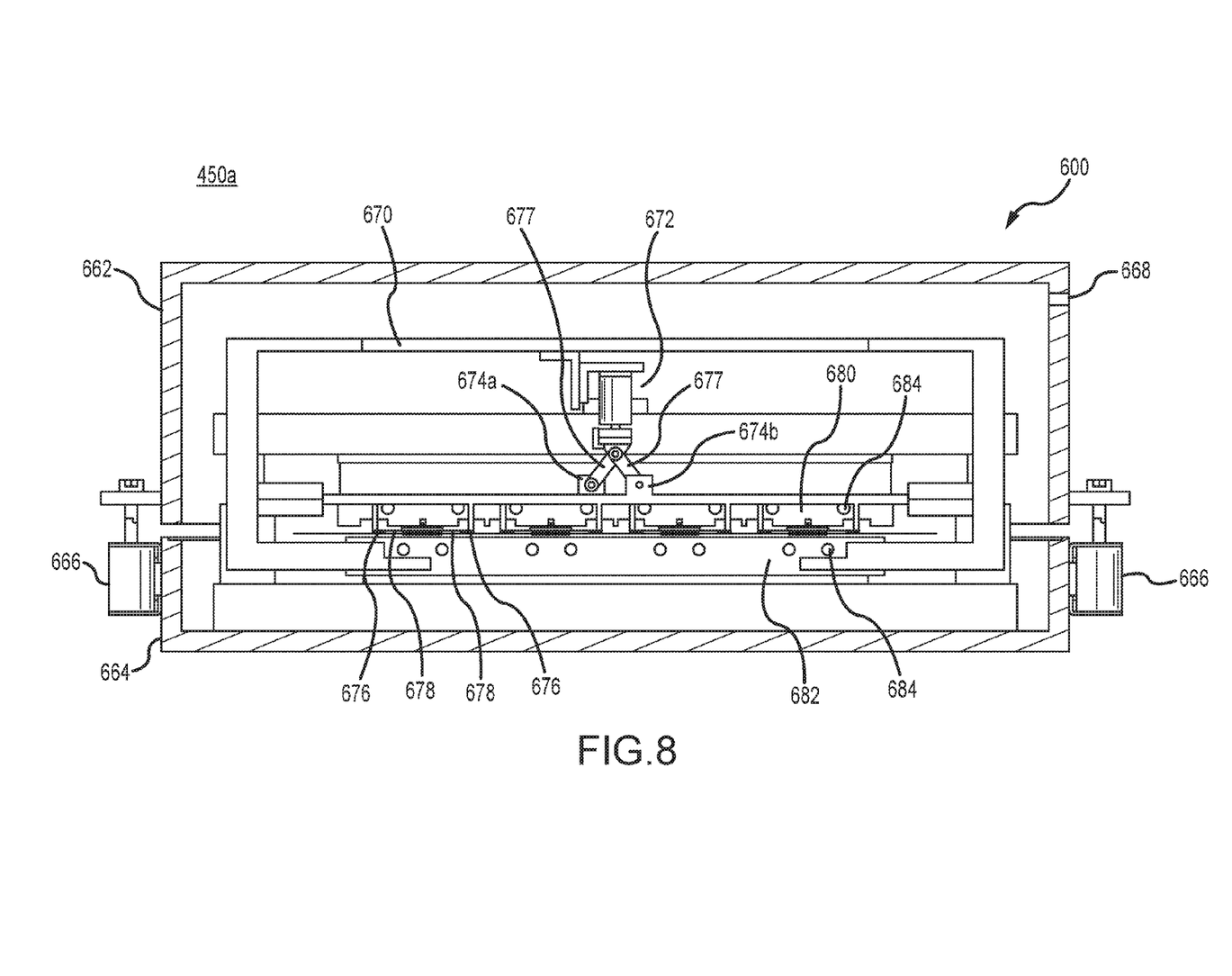
FIG. 8 is a cross-sectional side view of a vacuum box of a sealing system in accordance with the present disclosure that has not yet been closed.

Once the package components have be placed within vacuum box 600, the upper portion 662 and lower portion 664 may be mated to create a hermetically or near-hermetically sealed vacuum box 600. Mating of the upper portion 662 and lower portion 664 may be manual or automated. For example, in the illustrated embodiment vacuum box actuators 666 are provided to raise and lower the upper portion 662 with respect to the lower portion 664.

Figure 9:
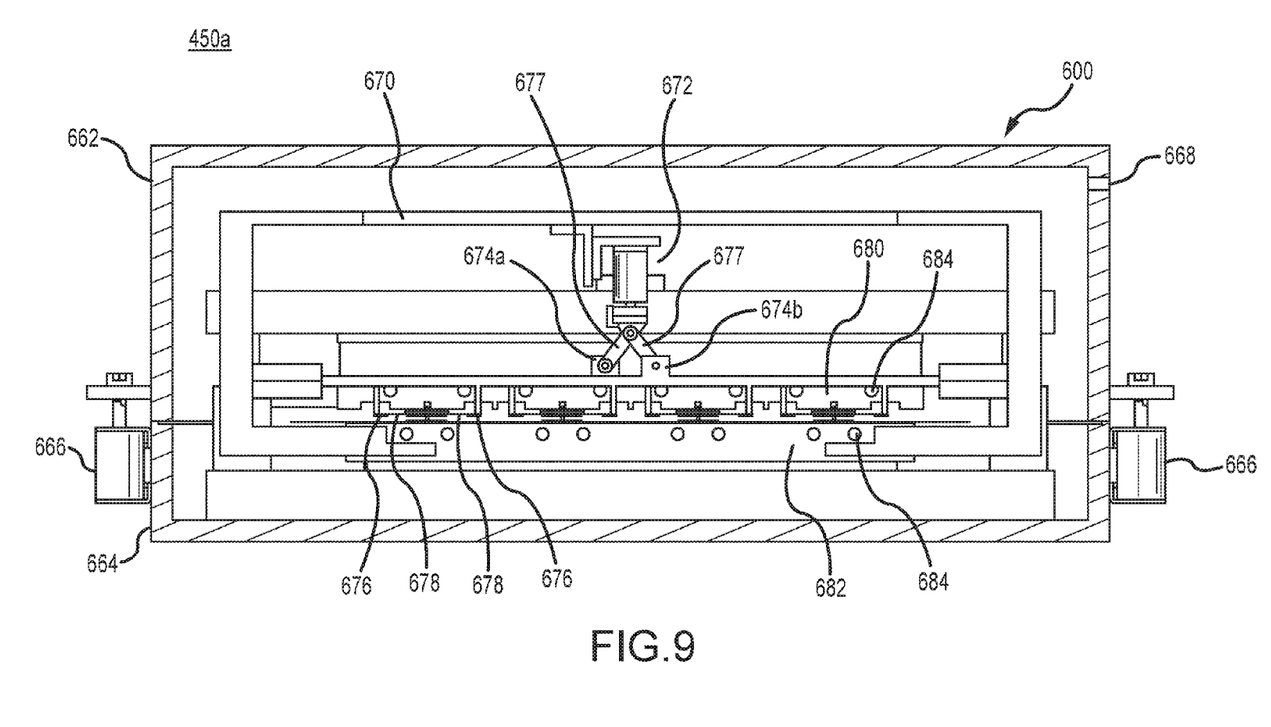
FIG. 9 is a cross-sectional side view of a vacuum box of a sealing system in accordance with the present disclosure that has been closed.

With reference to FIG. 9, once the package components have been placed in vacuum box 600 and the upper portion 662 the lower portion 664 have been sealed, a vacuum (V) is generated with the vacuum box 600 by pumping air from the vacuum box through one or more vacuum ports 668.

Within vacuum box 600, structure is provided for handling and processing the various package components. For example, the present disclosure contemplates lead separating mechanisms for maintaining an air gap between the bases 601 and the lids 602 to be mated to ensure evacuation of air during the vacuum generation. The lead separating mechanisms may be any conventional mechanism that allows the bases 601 or lids 602 to be handled in such a way that they are separated from one another to create the noted air gap. For example, known "pick and place" or "lift and release" systems are contemplated herein. Alternatively, various known vacuum holding or carrying systems (such as those disclosed in U.S. Pat. No. 5,056,296 which is incorporated by reference), may likewise be employed. Other as yet unknown lead separating and holding mechanisms may likewise be used and still fall within the present scope.

Figure 10:
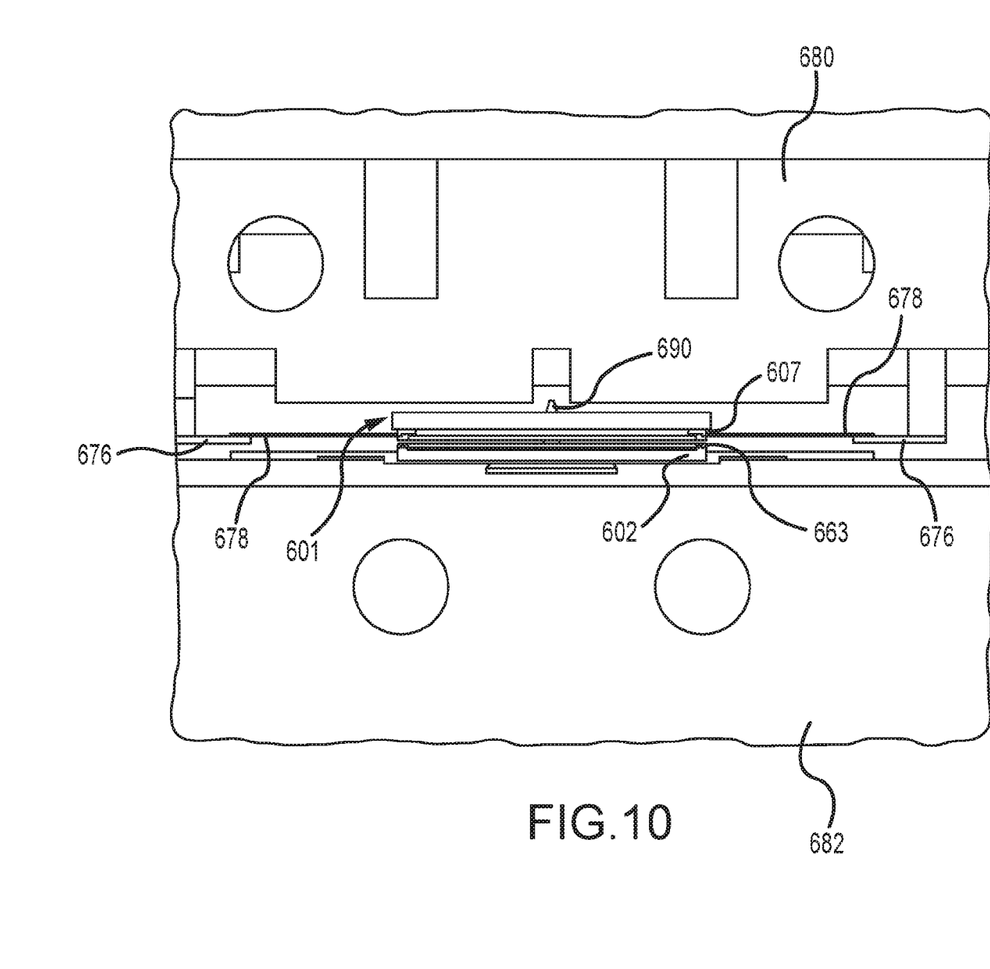
FIG. 10 is a close-up cross-sectional side view of package components in a vacuum box of a sealing system in accordance with the present disclosure showing an air gap maintained between the package components.

For example, in an embodiment and with specific reference to FIGS. 8 and 10, the present disclosure contemplates a lead separating mechanism for maintaining an air gap between the bases 601 and the lids 602 to be mated to ensure evacuation of air during the vacuum generation that comprises comprise a lead separator actuator mounting frame 670 to which a lead separator actuator 672 is mounted. Coupled to the lead separator actuator 672, either directly or indirectly (e.g., using pivot arms or the like, such as described below), are two opposing lead frame separators 674a, 674b which translate in opposite directions.

Each of the two lead frame separators 674a, 674b has one or more lead carriers 676 which support the leads 678 of the packages being assembled and maintain the above-noted air gap. In the illustrated embodiment, each lead frame separators 674a, 674b has four lead carriers 676, though the actual number may vary depending on the number of packages processed at one time. Each lead carrier 676 on each lead frame separator 674a, 674b faces inwardly towards the center of the vacuum box 600, such that each package base and lead frame being assembled is supported by leads 678 extending therefrom on one side and resting on a lead carrier 676 on lead frame separator 674a, and is supported on the other side by a lead carrier 676 on the other lead frame separator 674b.

More specifically, as can be seen in the close-up in FIG. 10, the leads 678 of the package rest on the lead carriers 676 which are positioned such that the base 601 and sidewalls 607 of the package are elevated above the adhesive 603 and lid 602 of the package to create the air gap allowing air to escape and create the vacuum (V) between the package components. After the vacuum (V) has been created, the lead carriers are retracted, allowing the leads 678, sidewalls 607 and bases 601 to lower, contact, and mate with the adhesive 603 and the lid 602. At this point, heat and pressure are applied to begin the curing and sealing process.

Figure 11:
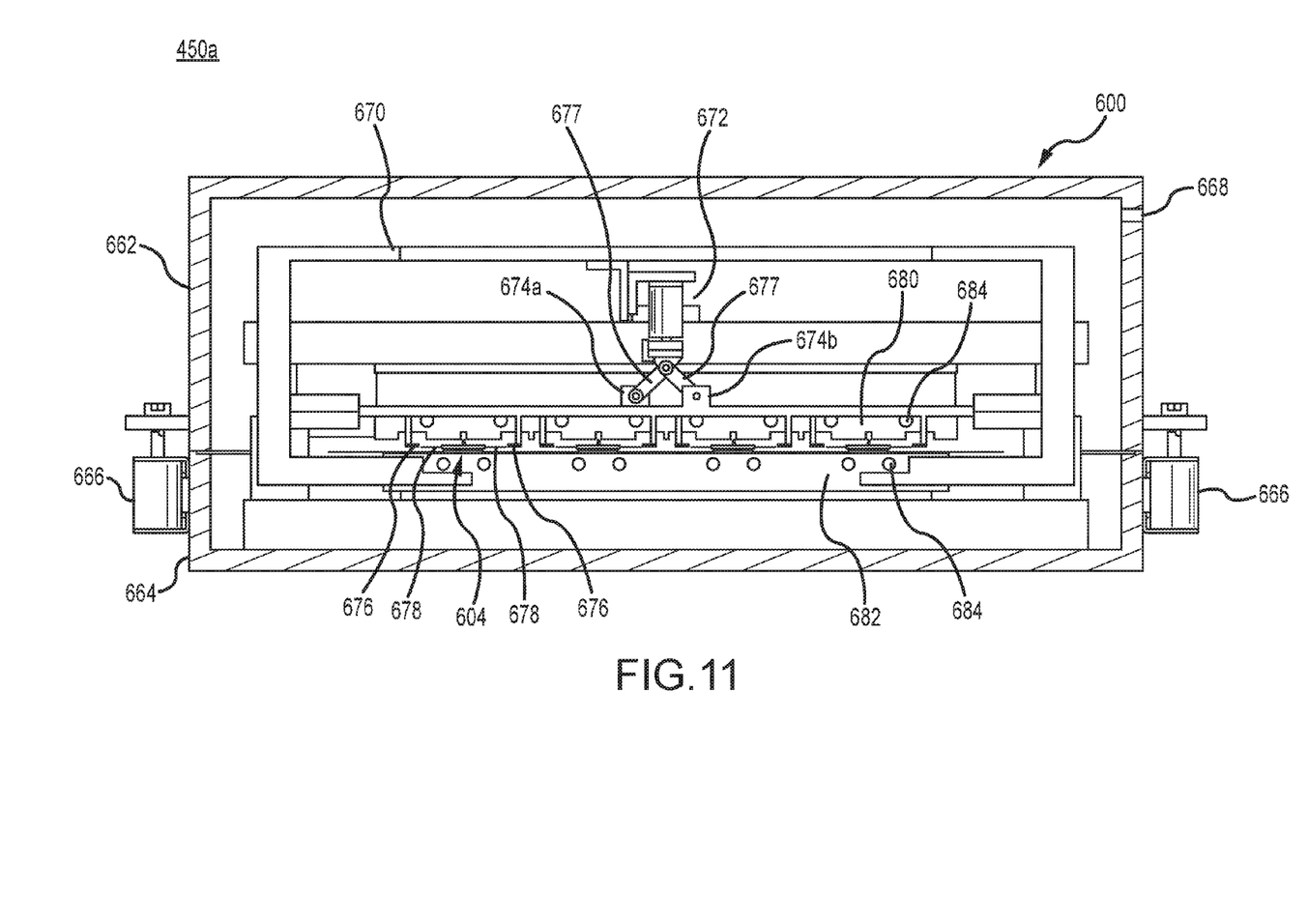
FIG. 11 is a cross-sectional side view of a vacuum box of a sealing system in accordance with the present disclosure showing mated package components with no air gap.
Figure 12:
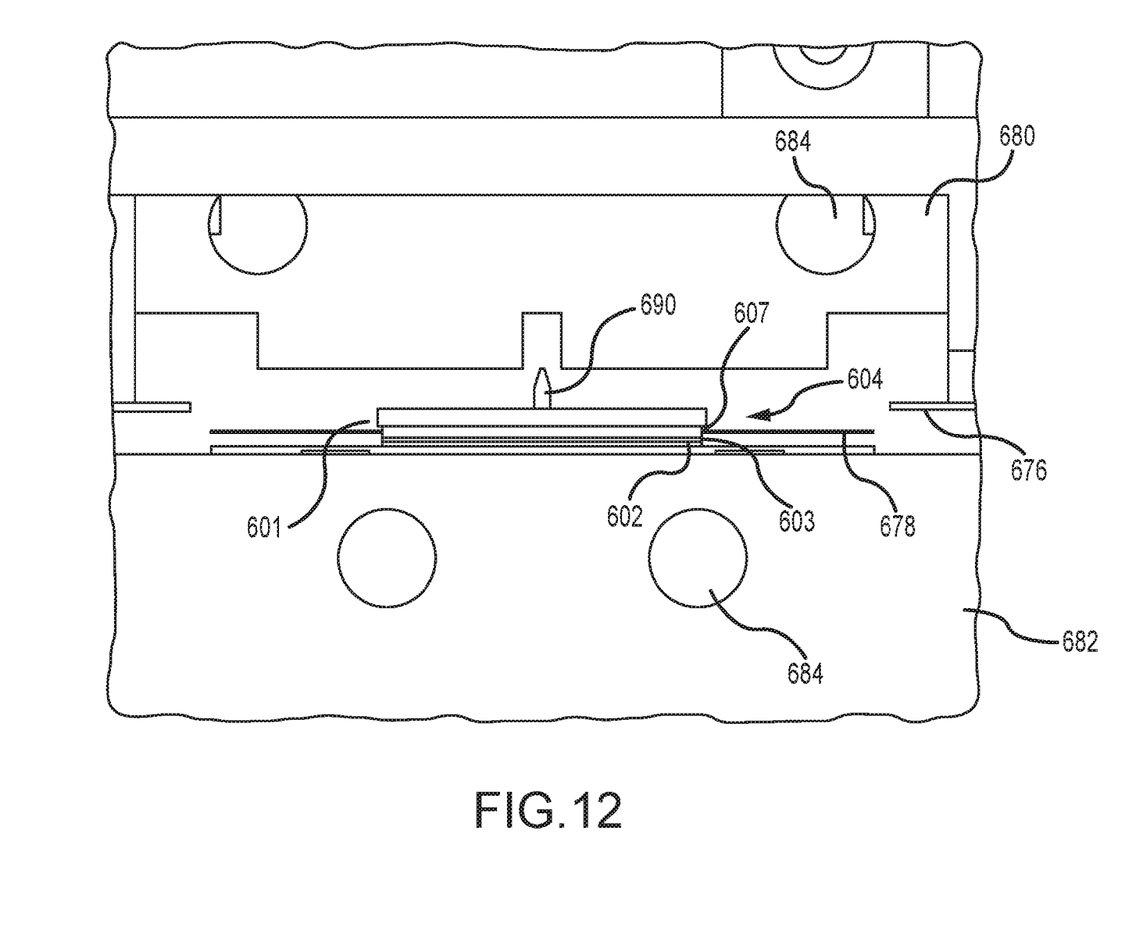
FIG. 12 is a close-up cross-sectional side view of mated package components with no air gap in a vacuum box of a sealing system in accordance with the present disclosure.

For example, with reference to FIGS. 11 and 12, in accordance with the presently described embodiment, the lead carriers 676 are retracted by actuation of the lead frame separators 674a, 674b using the lead separator actuator 672. When the lead separator actuator 672 is engaged, pivot arms 677 translate (e.g., lateral) motion from the lead separator actuator 672 in a first direction (e.g., vertically) to a second direction (e.g., horizontally) thereto, causing the lead frame separators 674a, 674b to widen horizontally to a point at which the lead carriers 676 found on each lead frame separator 674a, 674b no longer contact and support the leads 678, causing the leads 678, sidewalls 607 and bases 601 to lower, contact and mate with the adhesive 603 and the lids 602 to form mated package assemblies 604.

Once the leads 678, sidewalls 607 and bases 601 have been lowered to be mated with the adhesive 603 and the lids 602, heat and pressure can be applied. As noted above, conventional known or as yet unknown inductive, conductive, convective, or radiative heating mechanisms and elements may be used. For example, with reference to FIGS. 8-13 upper and lower heating blocks 680, 682 are provided to heat the mated package assemblies 604. In the presently described embodiment, the upper and lower heating blocks 680, 682 are manufactured from materials having good conductive properties, such as metals. In the upper and lower heating blocks 680, 682 are holes 684 in which are inductive heating elements, and when energized, heat the mated package assemblies to the appropriate curing temperature.

During and after the heating of the package components, compressive pressure may be applied on the mated package assemblies 604 to help ensure sealing. For example, with reference to FIG. 13, in accordance with an embodiment, the lead frame separators 674a, 674b may also exert a compressive force through the upper heating block 680 to the base 601 and the rest of the mated package assemblies 604.

Additionally, as noted above, various locating mechanisms including slots, receptacles, pins and the like are contemplated for ensuring the accurate and proper alignment of the package components. For example, as illustrated in FIGS. 8-13, locating posts 690 are provided, against which the various package components abut and ensure accurate alignment of the package components.

Figure 13:
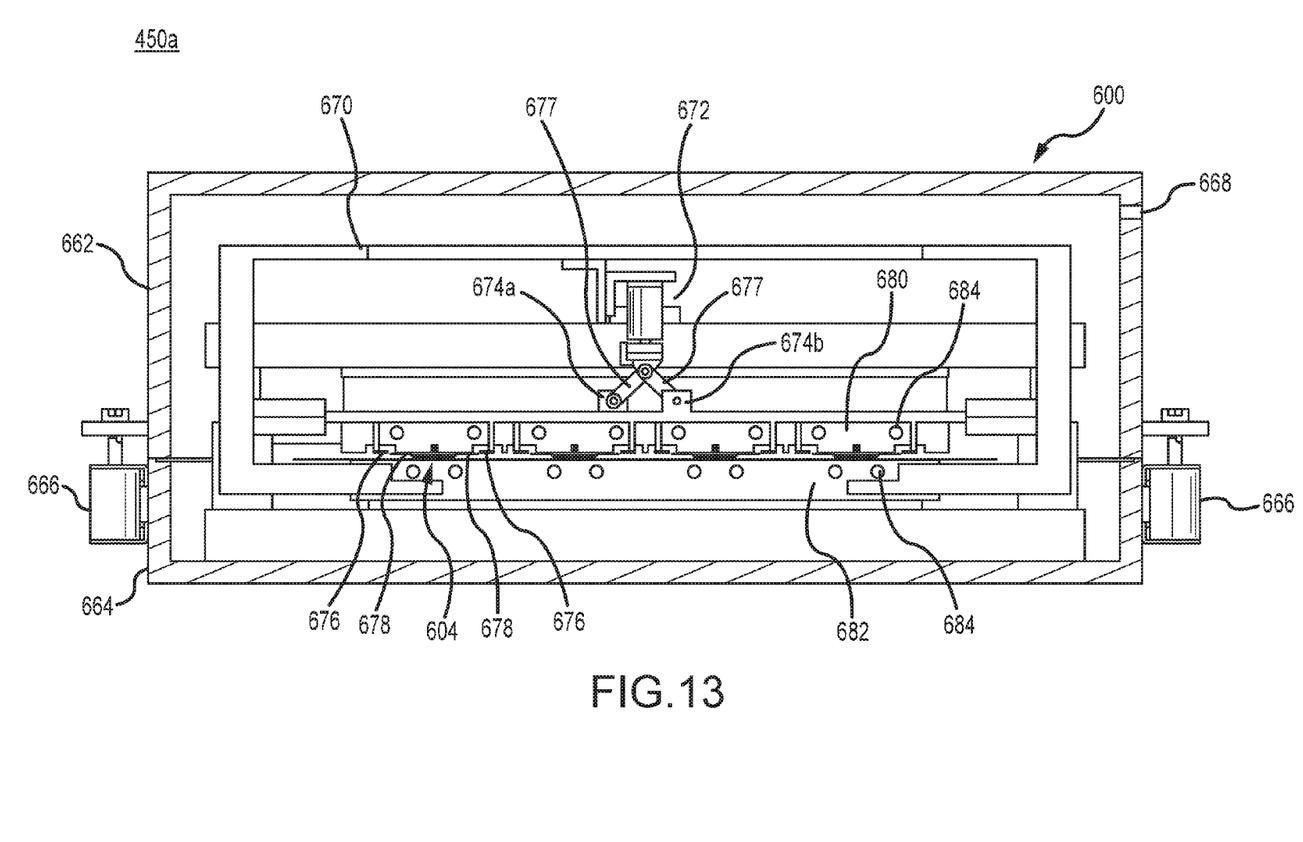
FIG. 13 is a cross-sectional side view of a vacuum box of a sealing system in accordance with the present disclosure showing pressure being exerted on mated package components.

As noted above, after the desired vacuum, heating and pressure time has passed (e.g., 2 minutes). The vacuum box 600 may be opened, and the partially cured and sealed mated package assemblies 604 may be removed and transported to the next station for further processing, while new package components ready for sealing are transported into the vacuum box 600 where the process is repeated.

In accordance with various embodiments, vacuum sealing systems in accordance with the present disclosure may have at least one internal compression stop within the various processing chambers (e.g., vacuum box 600) and prevents compression of the mated package assemblies 604 lower than the internal compression stop height. The inclusion of the internal compression stop may comprise pins, lips, posts and/or other protrusions that prevent the portions of the sealing systems that compress the mated package assemblies 604 during curing from compressing beyond a certain point. By preventing this compression, obtaining a mated package assemblies 604 that have consistent heights are possible, irrespective of variations in the specifications of the components that make up the final mated package assembly 604 (e.g., the base, lid, etc.) as well as differences in bond line thicknesses. Additionally, in various embodiments, the internal compression stop may adjustable so that heights of the mated package assemblies 604 may be varied.

Finally, the foregoing description emphasizes particular embodiments and examples of the contemplated disclosure. However, as those skilled in the art will recognize, however, the scope of the present disclosure extends as well to variations and modifications of the above, in terms of materials, operating conditions, operating procedures, and other parameters of the construction of electronic packages and their components and of procedures for their assembly.

Likewise, numerous characteristics and advantages have been set forth in the preceding description, including various alternatives together with details of the structure and function of the methods and systems described herein. The disclosure is intended as illustrative only and as such is not intended to be exhaustive. It will be evident to those skilled in the art that various modifications may be made, especially in matters of order, process, structure, elements, components, and arrangement including combinations of the same within the principles of the disclosure, to the full extent indicated by the broad, general meaning of the terms in which the appended claims are expressed. To the extent that these various modifications do not depart from the spirit and scope of the appended claims, they are intended to be encompassed therein.

What is claimed is:

1. A sealing process for air cavity electronic packages comprising the steps of:
    providing a base and a lid, at least one of the base and the lid having a mating surface coated with an adhesive;
    maintaining an air gap between the base and the lid;
    generating a vacuum around the base, the lid, and the adhesive;
    mating the base and the lid together after the vacuum has been generated to create a mated package assembly with a vacuum therein; and
    heating the mated package assembly to a curing temperature to cure the adhesive.

2. The sealing process of claim 1, further comprising the step of applying pressure to the mating surface after heating the mated package assembly to the curing temperature.

3. The sealing process of claim 1, wherein the base, the lid and the adhesive are placed in a vacuum box comprising a first portion and a second portion.

4. The sealing process of claim 1, further comprising a plurality of corresponding bases and lids.

5. The sealing process of claim 1, further comprising providing at least one locating mechanism for aligning at least one of the base and the lid.

6. The sealing process of claim 1, wherein the adhesive comprises a thermosetting adhesive.

7. The sealing process of claim 1, wherein the air cavity electronic package is a three piece package comprising a sidewall attached to the base, and the lid.

8. A sealing process for a plurality of air cavity electronic packages comprising the steps of:
provim a plurality of corresponding bases and lids, wherein at least one of each corresponding base and lid has a mating surface coated with an adhesive; and
maintaining an air gap between each corresponding base and lid;
generating a vacuum around the plurality of corresponding bases and lids;
mating the corresponding bases and lids together after the vacuum has been generated to create a plurality of mated package assemblies, each with a vacuum therein; and
heating the plurality of mated package assemblies to a curing temperature to cure the adhesive.

9. The sealing process of claim 8, further comprising the step of applying pressure to the mating surfaces after heating the mated package assemblies to the curing temperature.

10. The sealing process of claim 8, wherein the corresponding bases and lids are placed in a vacuum box comprising an upper portion and a lower portion.

11. The sealing process of claim 8, further comprising providing locating mechanisms for aligning the corresponding bases and lids.

12. The sealing process of claim 8, wherein the adhesive comprises a thermosetting adhesive.

13. The sealing process of claim 8, wherein the air cavity electronic packages are three piece packages.

14. A vacuum box sealing air cavity electronic packages, comprising:
an upper portion and a lower portion which can be opened and closed, and when closed define an internal volume for receiving a package base with leads extending therefrom and a package lid, wherein at least one of the package base and the package lid have an adhesive on a mating surface, and wherein the vacuum box has a vacuum port;
at least one actuator for opening and closing the vacuum box;
a lead separating mechanism within the internal volume for maintaining an air gap between the package base and the package lid, the lead separating mechanism further comprising a lead separator actuator;
at least two opposing lead frame separators coupled to the lead separator actuator, the two opposing lead frame separators each having at least one lead carrier for supporting the leads, wherein upon actuation of the lead separator actuator, the lead frame separators move to retract the lead carriers from the leads, causing the package base to mate with the package lid with the adhesive therebetween, closing the air gap and creating a mated package assembly; and
at least one heating block for heating the mated package assembly to a curing temperature.

15. The vacuum box of claim 14, wherein when the lead separator actuator is engaged, pivot arms translate motion from the lead separator actuator in a first direction to a second direction, causing the lead frame separators to widen to a point at which the lead carriers no longer contact and support the leads.

16. The vacuum box of claim 14, further comprising an upper heating block and a lower heating block.

17. The vacuum box of claim 16, wherein the lead frame separators exert a compressive force through the upper heating block to the mated package assembly.

18. The vacuum box of claim 14, further comprising a plurality of corresponding package bases and package lids.

19. The vacuum box of claim 18, further comprising locating posts for aligning the package bases and the package lids.

20. The vacuum box of claim 14, wherein the lead frame separators translate in opposite directions to retract the lead carriers from the leads.

* * * * *